United States Patent
Lee et al.

(10) Patent No.: US 11,715,784 B2
(45) Date of Patent: *Aug. 1, 2023

(54) METHOD FOR FORMING A HIGH-VOLTAGE METAL-OXIDE-SEMICONDUCTOR TRANSISTOR DEVICE

(71) Applicant: UNITED MICROELECTRONICS CORP., Hsin-Chu (TW)

(72) Inventors: Zhi-Cheng Lee, Tainan (TW); Wei-Jen Chen, Tainan (TW); Kai-Lin Lee, Kinmen County (TW); Tai-Ju Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/824,917

(22) Filed: May 26, 2022

(65) Prior Publication Data
US 2022/0285522 A1    Sep. 8, 2022

Related U.S. Application Data

(63) Continuation of application No. 17/102,319, filed on Nov. 23, 2020, now Pat. No. 11,380,777.

(51) Int. Cl.
*H01L 29/06*    (2006.01)
*H01L 29/66*    (2006.01)

(52) U.S. Cl.
CPC ...... *H01L 29/6659* (2013.01); *H01L 29/0642* (2013.01); *H01L 29/66681* (2013.01)

(58) Field of Classification Search
None
See application file for complete search history.

(56) References Cited

U.S. PATENT DOCUMENTS

| | | |
|---|---|---|
| 5,217,910 A | 6/1993 | Shimizu |
| 5,258,319 A | 11/1993 | Inuishi |
| 5,262,337 A | 11/1993 | Kim |
| 5,372,957 A | 12/1994 | Liang |
| RE35,036 E | 9/1995 | Yabu |
| 6,528,375 B2 | 3/2003 | Gregory |
| 7,011,998 B1 | 3/2006 | Ju |

(Continued)

*Primary Examiner* — Xiaoming Liu
(74) *Attorney, Agent, or Firm* — Winston Hsu

(57) ABSTRACT

A semiconductor substrate is provided. A trench isolation region is formed in the semiconductor substrate. A resist pattern having an opening exposing the trench isolation region and partially exposing the semiconductor substrate is disposed adjacent to the trench isolation region. A first ion implantation process is performed to implant first dopants into the semiconductor substrate through the opening, thereby forming a well region in the semiconductor substrate. The trench isolation region is within the well region. A second ion implantation process is performed to implant second dopants into the semiconductor substrate through the opening, thereby forming an extended doped region contiguous with the well region. The resist pattern is then removed. After removing the resist pattern, a gate dielectric layer is formed on the semiconductor substrate. A gate is then formed on the gate dielectric layer. The gate overlaps with the extended doped region.

10 Claims, 4 Drawing Sheets

(56) References Cited

U.S. PATENT DOCUMENTS

| | | |
|---|---|---|
| 7,022,560 B2 | 4/2006 | Olofsson |
| 7,071,046 B2 | 7/2006 | Yang |
| 9,570,451 B1 | 2/2017 | Hsiao |
| 11,380,777 B2 * | 7/2022 | Lee .................... H01L 29/66681 |
| 2003/0197230 A1 * | 10/2003 | Mocuta ........... H01L 21/823828 |
| | | 257/407 |
| 2015/0364598 A1 * | 12/2015 | Jung ................. H01L 29/66659 |
| | | 438/286 |
| 2016/0079305 A1 * | 3/2016 | Yamamoto ........ H01L 21/26513 |
| | | 438/59 |

* cited by examiner

METHOD FOR FORMING A HIGH-VOLTAGE METAL-OXIDE-SEMICONDUCTOR TRANSISTOR DEVICE

CROSS REFERENCE TO RELATED APPLICATIONS

This application is a continuation application of U.S. application Ser. No. 17/102,319, filed on Nov. 23, 2020. The content of the application is incorporated herein by reference.

BACKGROUND OF THE INVENTION

Field of the Invention

The present invention relates to the field of semiconductor technology. In particular, the present invention relates to a method for forming a high-voltage metal-oxide-semiconductor (HVMOS) transistor device.

Description of the Prior Art

High-voltage metal-oxide-semiconductor (HVMOS) devices are widely used for many types of high-voltage circuits such as input/output circuits, CPU power supply circuits, power management systems, AC/DC converters, etc. The commonly seen HVMOS devices include lateral-diffused metal-oxide-semiconductor (LDMOS) devices and double-diffused drain MOS (DDDMOS) devices.

As known in the art, high-voltage devices have been integrated into advanced core/IO CMOS platforms on the same chip to achieve the goals of lower power consumption, miniaturization, and reduced cost. However, it is difficult to improve the performance of the embedded high-voltage NFET devices without degrading breakdown voltage $V_{BD}$ of the high-voltage NFET devices that is operated at high voltage of above 38V.

The design of the high-voltage N field well of the high-voltage NFET devices is critical. To improve the performance such as ON current $I_{ON}$ of the embedded high-voltage NFET devices, one approach is increasing the doping concentration of the high-voltage N field well. However, the breakdown voltage $V_{BD}$ of the high-voltage NFET devices is affected due to the increased doping concentration of the high-voltage N field well.

SUMMARY OF THE INVENTION

One object of the present invention is to provide an improved method for forming a high-voltage semiconductor device to solve the deficiencies or shortcomings of the prior art.

One aspect of the invention provides a method for forming a high-voltage metal-oxide-semiconductor (HVMOS) transistor device. A semiconductor substrate having a first conductivity type is provided. A trench isolation region is formed in the semiconductor substrate. A resist pattern comprising an opening exposing the trench isolation region and partially exposing the semiconductor substrate is disposed adjacent to the trench isolation region. A first ion implantation process is performed to implant first dopants into the semiconductor substrate through the opening, thereby forming a well region having a second conductivity type in the semiconductor substrate. The trench isolation region is within the well region. A second ion implantation process is performed to implant second dopants into the semiconductor substrate through the opening, thereby forming an extended doped region having the second conductivity type and being contiguous with the well region. The resist pattern is then removed. After removing the resist pattern, a gate dielectric layer is formed on the semiconductor substrate. A gate is then formed on the gate dielectric layer. The gate overlaps with the extended doped region. The well region is not subjected to any counter-doping ion implantation.

According to some embodiments, the extended doped region is disposed directly under the gate.

According to some embodiments, the gate partially overlaps with the well region and the trench isolation region.

According to some embodiments, the first dopants comprises phosphorous, and wherein the well region comprises an upper portion and a lower portion, wherein the upper portion has a first doping concentration and the lower portion has a second doping concentration that is smaller than the first doping concentration.

According to some embodiments, the second dopants comprises phosphorous, and wherein the extended doped region has a third doping concentration that is substantially equal to the first doping concentration.

According to some embodiments, the extended doped region has a junction depth that is shallower than that of the well region.

According to some embodiments, the gate is a metal gate.

According to some embodiments, the first conductivity type is P type and the second conductivity type is N type.

According to some embodiments, the second ion implantation process is a tilt-angle ion implantation process.

According to some embodiments, the resist pattern has a thickness of about 2.25 micrometers and the opening has a width of about 1.5 micrometers, and wherein a tilt angle of the tilt-angle ion implantation process ranges between 24 degrees and 33.7 degrees.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
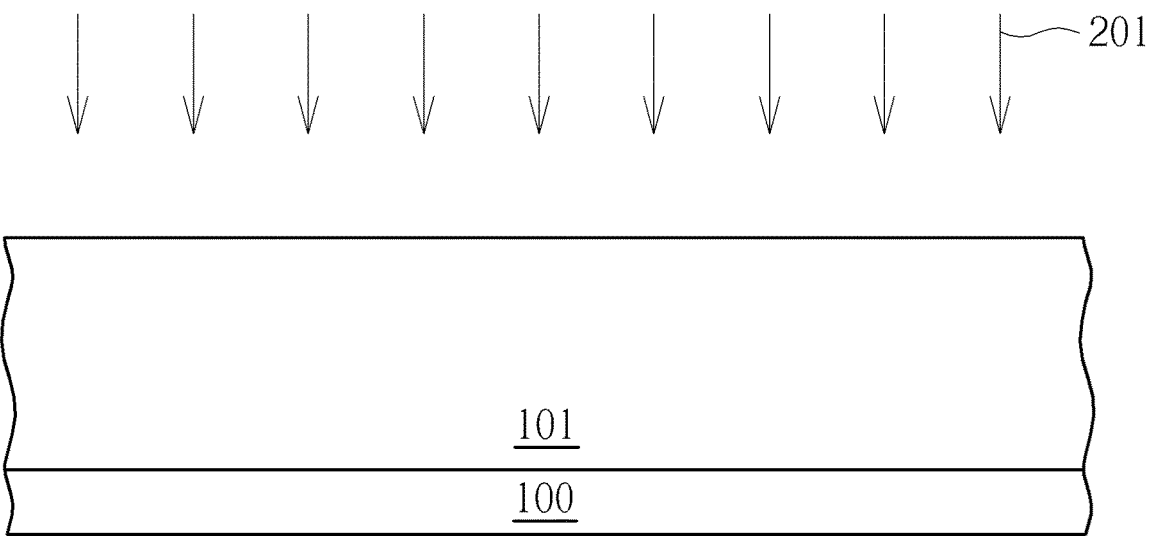
FIG. 1 to FIG. 8 are schematic, cross-sectional diagrams showing a method for fabricating a high-voltage metal-oxide-semiconductor (HVMOS) transistor device in accordance with one embodiment of the invention.

Please refer to FIG. 1 to FIG. 8. FIG. 1 to FIG. 8 are schematic, cross-sectional diagrams showing a method for fabricating a high-voltage metal-oxide-semiconductor (HV-MOS) transistor device in accordance with one embodiment of the invention. As shown in FIG. 1, a semiconductor substrate 100 having a first conductivity type such as P type is provided. According to one embodiment of the invention, the semiconductor substrate 100 may comprise a silicon substrate, but is not limited thereto. An ion implantation process 201 is performed to form a high-voltage P well (HVPW) 101 in the semiconductor substrate 100. Optionally, after the ion implantation process 201 is performed, a soak anneal process may be performed at about 1050 degrees Celsius for a time period of about 20000 seconds.

Figure 2:
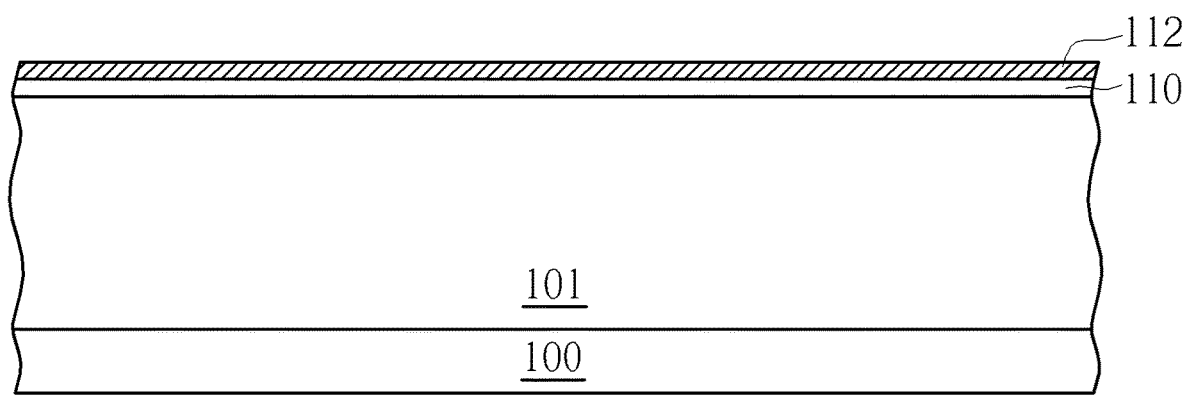

As shown in FIG. 2, subsequently, a pad oxide layer 110 and a pad nitride layer 112 are formed on the top surface of the semiconductor substrate 100. According to an embodiment, the pad oxide layer 110 may comprise a silicon dioxide layer, but is not limited thereto. According to an embodiment, the pad nitride layer 112 may comprise a silicon nitride layer, but is not limited thereto.

Figure 3:
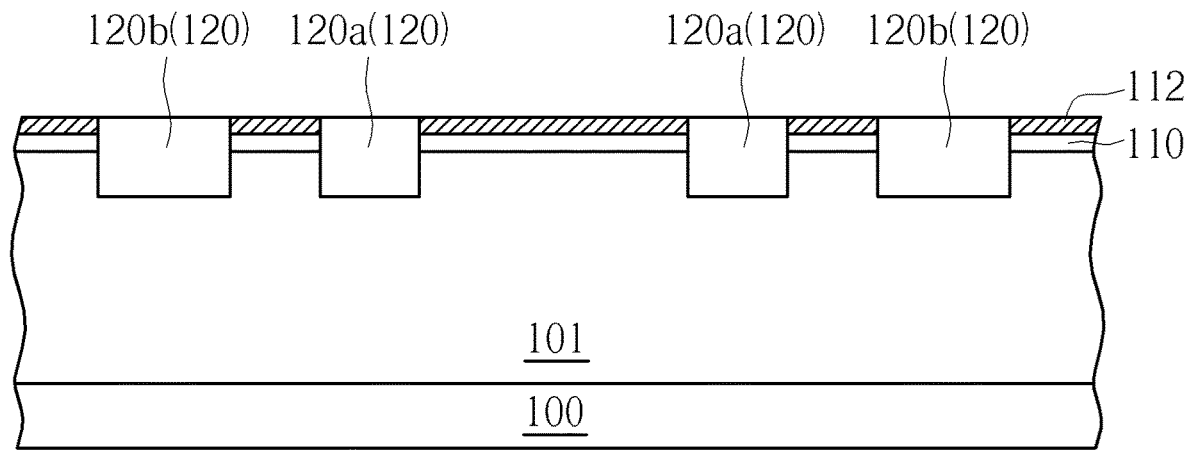

As shown in FIG. 3, a shallow trench isolation (STI) process may be carried out to form trench isolation regions 120 in the semiconductor substrate 100. According to an embodiment, the trench isolation regions 120 comprise a trench isolation region 120a and a trench isolation region 120b in proximity to the trench isolation region 120a. According to an embodiment, the STI process may involve the fabrication processes including, but not limited to, lithographic processes, etching processes, deposition processes, and planarization processes. Since the STI process is well-known in the art, the details of the process steps of forming the trench isolation regions 120 are omitted. Optionally, after the STI process is completed, a anneal process may be performed at about 1050 degrees Celsius for a time period of about 19000 seconds to densify the trench-fill oxide in the trench isolation regions 120.

Figure 4:
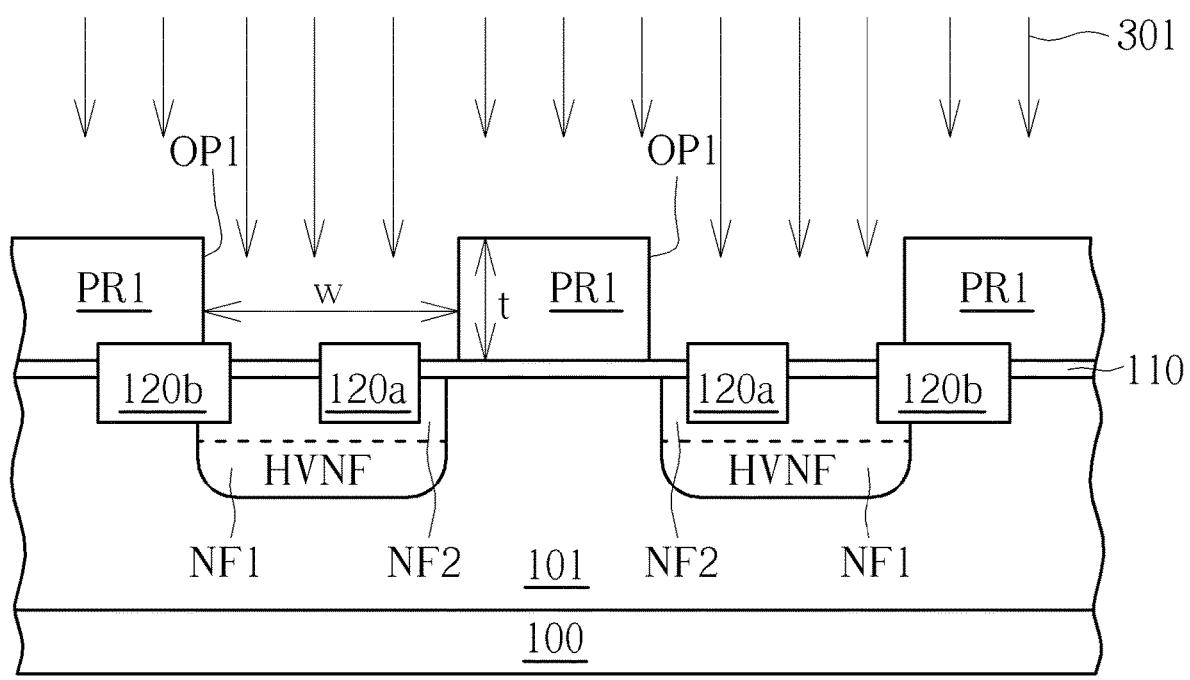

As shown in FIG. 4, a resist pattern PR1 is then formed on the semiconductor substrate 100. According to an embodiment, before the resist pattern PR1 is formed, the pad nitride layer 112 may be removed. According to an embodiment, the resist pattern PR1 may comprise a photoresist. The resist pattern PR1 comprises an opening OP1 exposing the trench isolation regions 120 and partially exposing the semiconductor substrate 100 adjacent to the trench isolation regions 120. According to an embodiment, the resist pattern PR1 has a thickness t of about 2.25 micrometers and the opening OP1 has a width w of about 1.5 micrometers. The exposed region defined by the opening OP1 is a high-voltage N drift region. Subsequently, an ion implantation process 301 is performed to implant first dopants into the semiconductor substrate 100 through the opening OP1, thereby forming a well region HVNF having a second conductivity type such as N type in the semiconductor substrate 100. According to an embodiment, the trench isolation region 120a is located within the well region HVNF. According to an embodiment, the trench isolation region 120b may partially overlap with the well region HVNF.

According to an embodiment, the first dopants may comprise phosphorous. According to an embodiment, the well region HVNF may comprise an upper portion NF2 and a lower portion NF1. According to an embodiment, the upper portion NF2 has a first doping concentration and the lower portion NF1 has a second doping concentration that is smaller than the first doping concentration. For example, the upper portion NF2 may be formed by implanting dopants such as phosphorous with implant energy of about 120 KeV and a dose of about 7E12/cm$^2$. For example, the lower portion NF1 may be formed by implanting dopants such as phosphorous with implant energy of about 400 KeV and a dose of about 5E12/cm$^2$.

Figure 5:
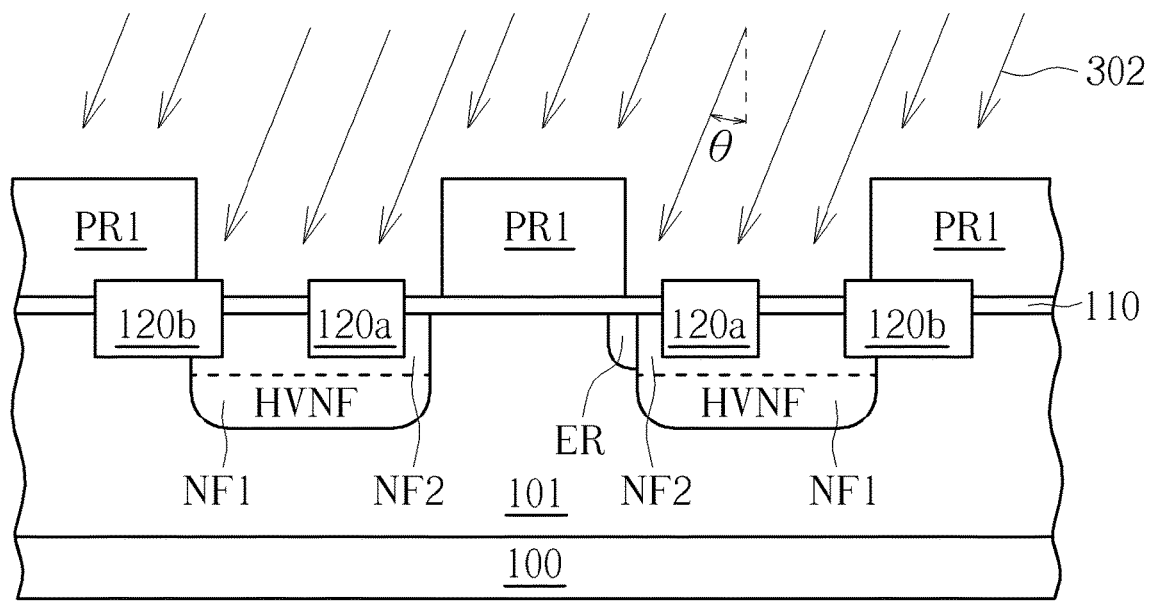

As shown in FIG. 5, after the ion implantation process 301 is completed, an ion implantation process 302 is performed to implant second dopants into the semiconductor substrate 100 through the opening OP1, thereby forming an extended doped region ER having the second conductivity type such as N type. According to an embodiment, the second dopants comprises phosphorous. According to an embodiment, the extended doped region ER is contiguous with the well region HVNF.

According to an embodiment, the ion implantation process 302 is a tilt-angle ion implantation process. According to an embodiment, a tilt angle θ of the ion implantation process 302 may range between 24 degrees and 33.7 degrees. For example, the extended doped region ER may be formed by implanting dopants such as phosphorous with implant energy of about 120 KeV and a dose of about 7E12/cm$^2$. According to an embodiment, the extended doped region ER has a third doping concentration that is substantially equal to the first doping concentration of the upper portion NF2 of the well region HVNF. According to an embodiment, the extended doped region ER has a junction depth that is shallower than that of the well region HVNF. Subsequently, the resist pattern PR1 is removed.

Figure 6:
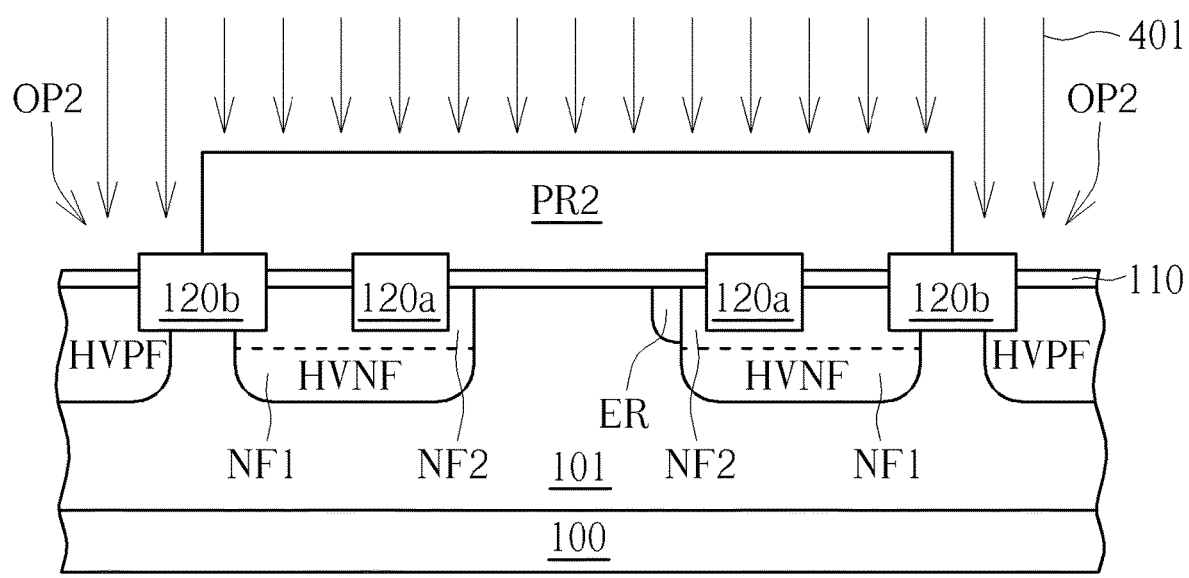

As shown in FIG. 6, a resist pattern PR2 is then formed on the semiconductor substrate 100. According to an embodiment, the resist pattern PR2 may comprise a photoresist. The resist pattern PR2 comprises an opening OP2 exposing a region that is adjacent to the well region HVNF. Subsequently, an ion implantation process 401 is performed to implant third dopants into the semiconductor substrate 100 through the opening OP2, thereby forming a well region HVPF having the first conductivity type such as N type in the semiconductor substrate 100. According to an embodiment, the trench isolation region 120b may partially overlap with the well region HVPF.

Figure 7:
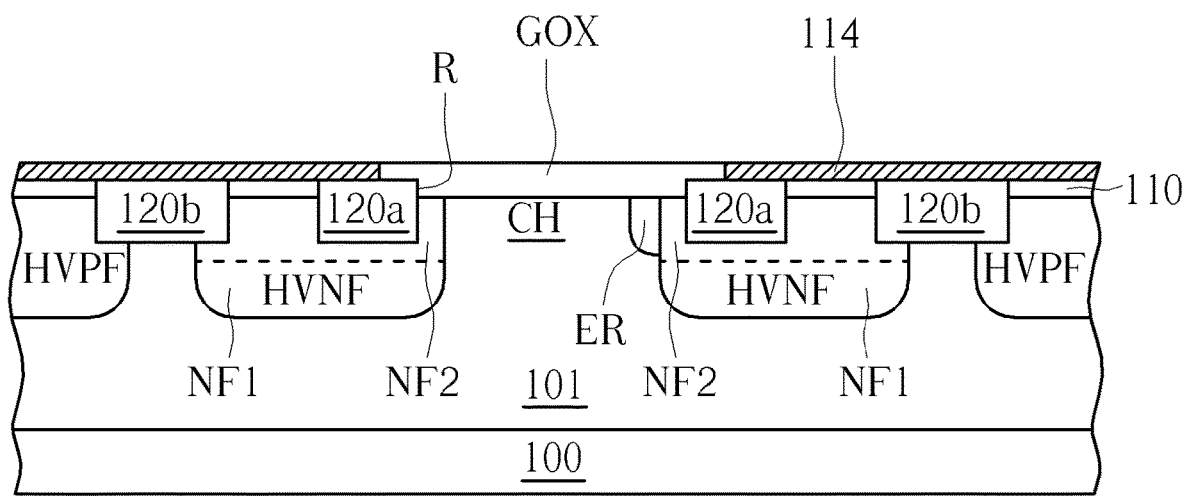

As shown in FIG. 7, subsequently, a gate dielectric layer GOX is formed on the semiconductor substrate 100. For example, to form the gate dielectric layer GOX, a silicon nitride layer 114 may be deposited on the semiconductor substrate 100. A lithographic process and an etching process may be performed to remove the silicon nitride layer 114 and the semiconductor substrate 100 from a channel region CH between the trench isolation regions 120a, thereby forming a recess R in the semiconductor substrate 100. A silicon oxide layer is then deposited in the recess R in the semiconductor substrate 100 by using a deposition method such as a chemical vapor deposition (CVD) method. A planarization process such as a chemical mechanical polishing (CMP) process may be performed to remove excess silicon oxide layer from the top surface of the silicon nitride layer 114.

Figure 8:
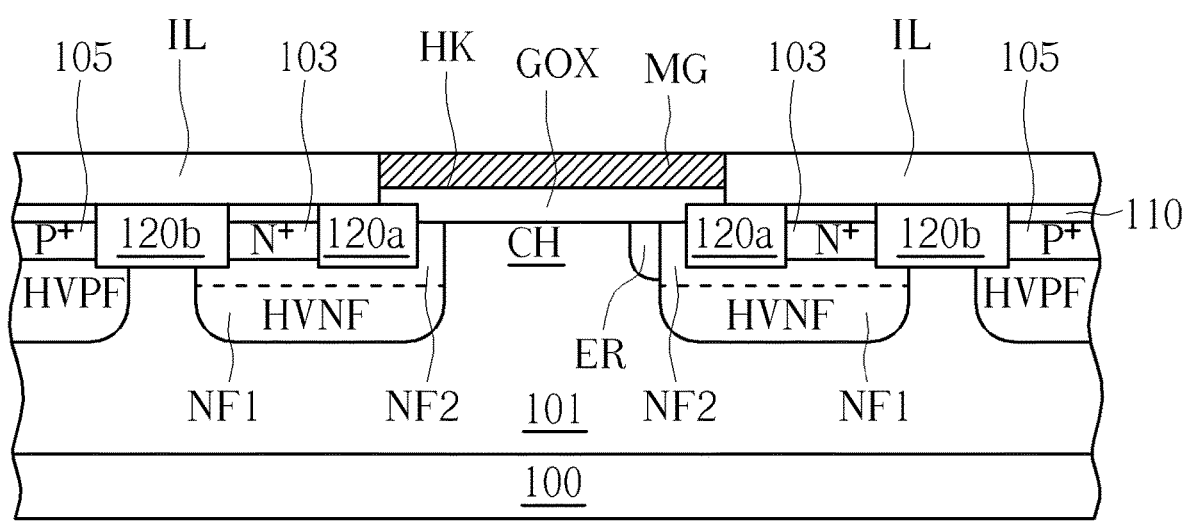

As shown in FIG. 8, after forming the gate dielectric layer GOX, the silicon nitride layer 114 may be removed. A heavily doped region 103 such as an N$^+$ doped region and a heavily doped region 105 such as a P$^+$ doped region may be formed in the well region HVNF and the well region HVPF, respectively. For example, the heavily doped region 103 and the heavily doped region 105 may be formed by using lithographic processes and ion implantation processes known in the art. An inter-layer dielectric (ILD) layer IL is then deposited over the semiconductor substrate 100. A gate MG is then formed in the ILD layer IL above the channel region CH. According to an embodiment, the gate MG may be a metal gate and may overlap with the extended doped region ER. According to an embodiment, the extended doped region ER is disposed directly under the gate MG. According to an embodiment, the gate MG partially overlaps with the well region HVNF and the trench isolation region 120a. According to an embodiment, the gate MG may be formed by using conventional replacement metal gate (RMG) processes. According to an embodiment, a high dielectric constant (high-k) dielectric layer HK may be formed between the gate MG and the gate dielectric layer GOX.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a high-voltage metal-oxide-semiconductor (HVMOS) transistor device, comprising:
    providing a semiconductor substrate having a first conductivity type;
    forming a first trench isolation region and a second trench isolation region spaced apart from the first trench isolation region in the semiconductor substrate;
    forming a resist pattern comprising a first opening exposing the first trench isolation region and partially exposing the semiconductor substrate adjacent to the first trench isolation region, and a second opening exposing the second trench isolation region and partially exposing the semiconductor substrate adjacent to the second trench isolation region;
    performing a first ion implantation process to implant first dopants into the semiconductor substrate through the first opening and the second opening, thereby forming a first well region having a second conductivity type surrounding the first trench isolation region and a second well region having the second conductivity type surrounding the second trench isolation region in the semiconductor substrate;
    performing a second ion implantation process to implant second dopants into the semiconductor substrate through the first opening and the second opening, thereby forming an extended doped region having the second conductivity type and being contiguous with the first well region;
    removing the resist pattern;
    after removing the resist pattern, forming a gate dielectric layer on the semiconductor substrate, wherein the gate dielectric layer is contiguous with the first trench isolation region and the second trench isolation region; and
    forming a gate on the gate dielectric layer, wherein the gate overlaps with the extended doped region, wherein the gate partially overlaps with the first trench isolation region and the second trench isolation region, wherein the well region is not subjected to any counter-doping ion implantation.

2. The method according to claim 1, wherein the extended doped region is disposed directly under the gate.

3. The method according to claim 1, wherein the gate partially overlaps with the first well region and the second well region.

4. The method according to claim 1, wherein the first dopants comprises phosphorous, and wherein the first well region comprises an upper portion and a lower portion, wherein the upper portion has a first doping concentration and the lower portion has a second doping concentration that is smaller than the first doping concentration.

5. The method according to claim 4, wherein the second dopants comprises phosphorous, and wherein the extended doped region has a third doping concentration that is substantially equal to the first doping concentration.

6. The method according to claim 1, wherein the extended doped region has a junction depth that is shallower than that of the first well region.

7. The method according to claim 1, wherein the gate is a metal gate.

8. The method according to claim 1, wherein the first conductivity type is P type and the second conductivity type is N type.

9. The method according to claim 1, wherein the second ion implantation process is a tilt-angle ion implantation process.

10. The method according to claim 9, wherein the resist pattern has a thickness of 2.25 micrometers and the first opening has a width of 1.5 micrometers, and wherein a tilt angle of the tilt-angle ion implantation process ranges between 24 degrees and 33.7 degrees.

* * * * *